(12) United States Patent
Farmer

(10) Patent No.: US 7,977,992 B2
(45) Date of Patent: Jul. 12, 2011

(54) PRECISION PHASE GENERATOR AND METHOD FOR PHASE GENERATION

(75) Inventor: Michael Martin Farmer, Fort Collins, CO (US)

(73) Assignee: Avago Technologies Enterprise IP (Singapore) Pte. Ltd., Singapore (SG)

( * ) Notice: Subject to any disclaimer, the term of this patent is extended or adjusted under 35 U.S.C. 154(b) by 1100 days.

(21) Appl. No.: 11/599,236

(22) Filed: Nov. 14, 2006

(65) Prior Publication Data

US 2008/0113642 A1  May 15, 2008

(51) Int. Cl.
*H03K 5/13* (2006.01)
(52) U.S. Cl. .................... 327/231; 327/232; 327/236
(58) Field of Classification Search .......... 327/231–234, 327/236–239, 243–244, 254–255, 291, 293, 327/298–299
See application file for complete search history.

(56) References Cited

U.S. PATENT DOCUMENTS

| | | | |
|---|---|---|---|
| 5,121,014 A | 6/1992 | Huang | |
| 5,485,126 A * | 1/1996 | Gersbach et al. | 331/57 |
| 5,506,534 A | 4/1996 | Guo et al. | |
| 5,602,512 A * | 2/1997 | Neron | 331/1 A |
| 6,052,003 A | 4/2000 | Molin et al. | |
| 6,396,888 B1 * | 5/2002 | Notani et al. | 375/364 |
| 6,414,557 B1 | 7/2002 | Liu | |
| 6,911,857 B1 | 6/2005 | Stiff | |
| 2005/0184781 A1 * | 8/2005 | Nagasue | 327/175 |

* cited by examiner

*Primary Examiner* — An T Luu

(57) ABSTRACT

A phase generator includes a delay element configured to receive an input signal and delay the input signal by a predetermined amount to develop a delayed version of the input signal, a logic element configured to receive the input signal and the delayed version of the input signal, the logic element configured to produce a signal dependent on a phase difference between the input signal and the delayed version of the input signal, a circuit configured to generate a reference signal, and a comparator configured to receive an output of the logic element and the reference signal. The comparator is configured to generate a control signal that is dependent on the difference between the output of the logic element and the reference signal, where the control signal is applied to the delay element to determine the delay applied to the input signal.

20 Claims, 4 Drawing Sheets

PRECISION PHASE GENERATOR AND METHOD FOR PHASE GENERATION

CROSS-REFERENCE TO RELATED APPLICATION

This application is related to commonly assigned U.S. patent application Ser. No. 11/599,237, entitled "Variable Delay Element," filed on Nov. 14, 2006, now U.S. Pat. No. 7,545,195, the entire disclosure of which is incorporated herein by reference.

BACKGROUND

There are many applications in which it is desirable to alter an input signal to provide at least one additional signal that is offset in phase from the input signal by a predetermined amount. Two examples of such applications include a quadrature modulator and a phase rotator. Using the example of a quadrature modulator, two phases of the input signal are generated and are ideally separated in phase by as close to 90 degrees as possible. Other applications require input signals separated in phase by other amounts. One problem in generating signals that are separated in phase by a precise amount is that variables such as component tolerance, noise, and other variables in current circuitry prevent the signals from being separated in phase by the desired amount.

Therefore, it would be desirable to have a phase generator that overcomes these shortcomings.

SUMMARY

In an embodiment, a phase generator comprises a delay element configured to receive an input signal and delay the input signal by a predetermined amount to develop a delayed version of the input signal, a logic element configured to receive the input signal and the delayed version of the input signal, the logic element further configured to produce a signal dependent on a phase difference between the input signal and the delayed version of the input signal, a circuit configured to generate a reference signal, and a comparator configured to receive an output of the logic element and the reference signal, the comparator configured to generate a control signal that is dependent on the difference between the output of the logic element and the reference signal, where the control signal is applied to the delay element to determine the delay applied to the input signal.

BRIEF DESCRIPTION OF THE DRAWINGS

The invention can be better understood with reference to the following drawings. The components in the drawings are not necessarily to scale, emphasis instead being placed upon clearly illustrating the principles of the phase generator. Moreover, in the drawings, like reference numerals designate corresponding parts throughout the several views.

DETAILED DESCRIPTION

Embodiments of the precision phase generator to be described below will be described in the context of a providing in-phase (I) and quadrature-phase (Q) signals in an integrated circuit. However, the precision phase generator can generate phases other than quadrature and can operate in systems other than an integrated circuit. The precision phase generator to be described below can be used to generate offset phase signals in any application.

Figure 1:
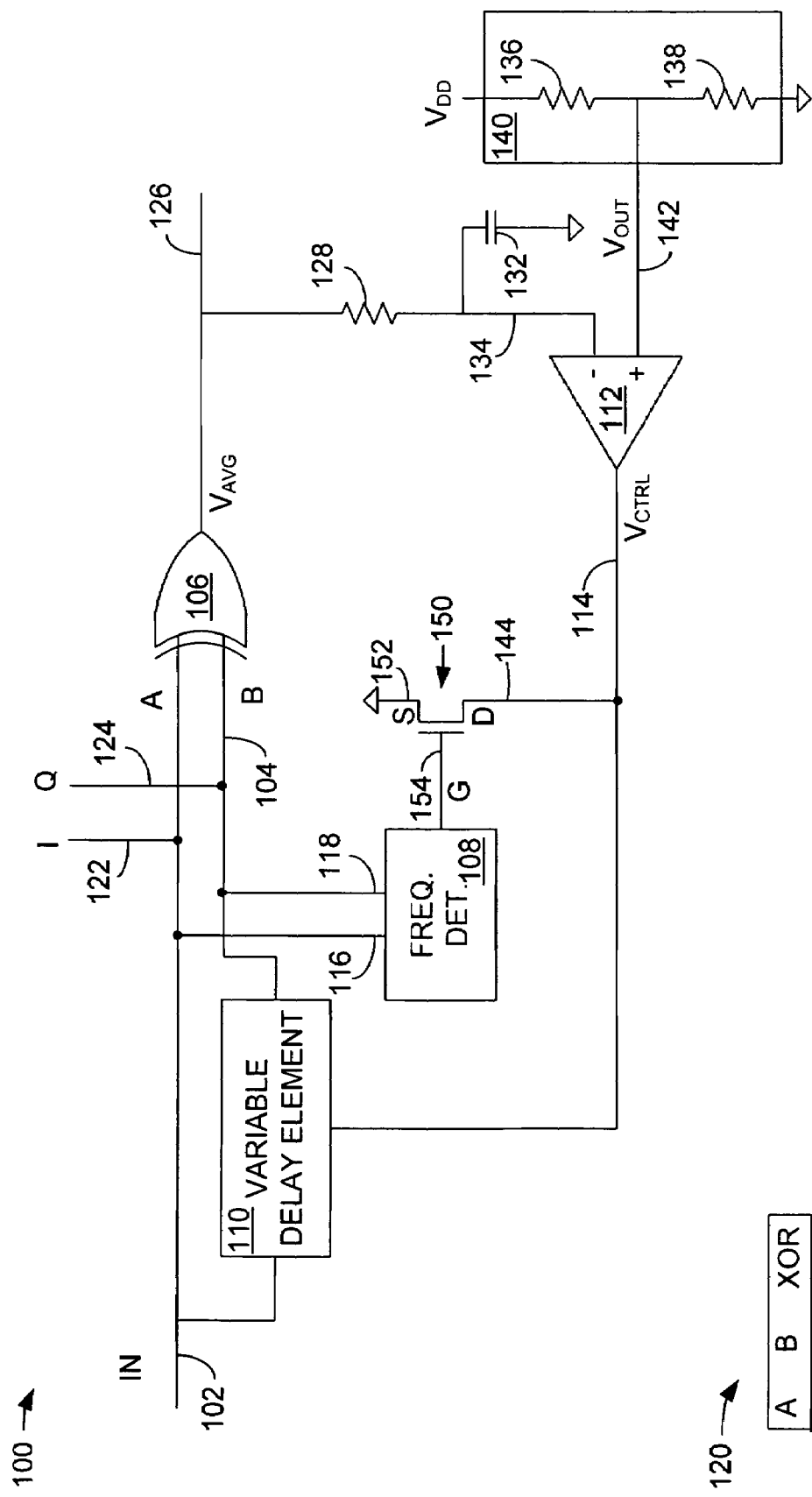
FIG. 1 is a block diagram illustrating an embodiment of a precision phase generator.

FIG. 1 is a block diagram illustrating an embodiment of a precision phase generator 100. The precision phase generator 100 will also be referred to as a phase generator. In the example of FIG. 1, the phase generator 100 will be described as generating signals that are offset in phase by substantially 90 degrees. These signals are referred to as quadrature signals. The reference to quadrature-phase, or any other phase offset is made with the understanding that signals that are offset in phase from one another can be offset by an amount that is not exact, but is substantially, or nominally accurate. For example, while a pair of signals may be referred to as quadrature, the signals may be offset in phase by substantially 90 degrees, also referred to as a nominal 90 degree offset, and still be referred to as quadrature signals.

The phase generator 100 comprises a logic element 106. In this embodiment, the logic element 106 is implemented as an exclusive OR (XOR) logic gate that operates as a phase detector. However, the logic element 106 can be any other logic gate that can operate as a phase detector. For example, an AND gate could be used as a phase detector. An example truth table for the logic element 106 is illustrated at 120. The output of the logic element 106 is logic high (logic 1) only when the inputs A and B are of opposite logical value.

An input signal is supplied over connection 102. The input signal can be any input signal and is typically an input clock signal generated elsewhere on an integrated circuit with which the phase generator 100 is associated. The input signal is also supplied to a variable delay element 110. The variable delay element 110 delays the input signal on connection 102 by a predetermined amount so that the signal on connection 104 at the output of the variable delay element 110 is delayed with respect to the input signal on connection 102. In the example shown in FIG. 1, the signal on connection 122 is referred to an in-phase (I) signal and the signal on connection 124 is referred to as a quadrature-phase (Q) signal. The difference in phase between the in-phase signal and the quadrature-phase signal is nominally 90 degrees. However, as will be described below, the phase generator 100 can generate signals that are separated in phase by amounts other than 90 degrees.

The output of the logic element 106 on connection 126 is a logic high value only when the inputs A and B have opposite logic values. The output of the logic element 106 is supplied to a reconstruction filter that comprises a resistance 128 and a capacitance 132. The signal on connection 134 is supplied to an inverting input of a comparator 112. In an embodiment, the comparator 112 can be implemented as an operational amplifier having an inverting and a non-inverting input. A reference signal is supplied to the non-inverting input of the comparator 112 via connection 142. A voltage divider 140 generates a reference signal on connection 142. The voltage divider 140 comprises a resistance 136 and a resistance 138. The resistance 136 is connected to a system voltage level, referred to as $V_{DD}$. The voltage divider 140 divides the voltage $V_{DD}$ based on the values of the resistances 136 and 138. The output, $V_{OUT}$, of the voltage divider 140 is characterized by the following equation.

$$V_{OUT} = V_{DD} * R1/R1 + R2, \qquad \text{Equation (1)}$$

where R1 is resistance 136 and R2 is resistance 138.

For example, the output $V_{OUT}$ of the voltage divider 140 on connection 142 will be a nominal value of $V_{DD}/2$ if the value of the resistance 136 is substantially the same as the value of the resistance 138. The comparator 112 compares the average output of the logic element 106 on connection 134 with the reference voltage level, $V_{OUT}$, on connection 142. The average value of a clock signal through complementary metal-oxide semiconductor (CMOS) logic will be referred to as $V_{AVG}$ and is given by the following equation:

$$V_{AVG} = \text{Duty\_Cycle} * V_{DD} \qquad \text{Equation (2)}$$

In this example, the output of the logic element 106 on connection 126 is the signal $V_{AVG}$. The output of the comparator 112 is an error signal representing the difference between the output, $V_{AVG}$, of the logic element on connection 126 and the reference voltage level, $V_{OUT}$, on connection 142. A difference between these levels causes the comparator 112 to generate a control signal, $V_{CTRL}$, on connection 114. The control signal, $V_{CTRL}$, is used to control the delay applied by the variable delay element 110. The operation of the variable delay element 110 is described in U.S. Pat. No. 7,545,195, entitled "Variable Delay Element,", the entire disclosure of which is incorporated herein by reference.

The value of the signal $V_{OUT}$ on connection 142 is a predetermined value and determines the value of the control signal, $V_{CTRL}$, on connection 114. For example, when the value of the resistances 136 and 138 are substantially the same, the variable delay element 110 will be driven by the comparator 112 to provide quadrature signals on connections 122 and 124 by delaying the signal on connection 104 nominally 90 degrees with respect to the input signal in connection 102. As another example, by choosing the values of the resistances 136 and 138 to result in a voltage level, $V_{OUT}$, of $V_{DD}/4$, the control signal, $V_{CTRL}$, will cause the variable delay element 110 to provide a 45 degree delay to the signal on connection 104. This will result in octature signals on connections 122 and 124 and an octature output of the logic element 106.

The phase generator 100 also comprises a frequency detector 108. The frequency detector 108 is coupled to the connection 102 via connection 116 and is coupled to the connection 104 via connection 118. The frequency detector 108 is also coupled to the signal $V_{CTRL}$ on connection 114 via a transistor 150. When the variable delay element 110 delays the signal on connection 104 by 180 degrees, the output from the variable delay element 110 ceases and the frequency detector 108 resets the control signal, $V_{CTRL}$, to zero. To reset the control signal, $V_{CTRL}$, to zero, the frequency detector 108 turns on a large pull-down device, such as the transistor 150. The drain terminal of the transistor 150 is connected to connection 144. The source terminal 152 of the transistor 150 is connected to ground. The transistor 150 is turned on via connection 154 when the frequency detector 108 determines that the delayed clock signal on connection 104 is not changing state relative to the input clock signal on connection 102. Because the transistor 150 is large and its impedance is low relative to the output stage of the comparator 112, the node 144 is quickly discharged to ground through the transistor 150, thus resetting the delay to its intrinsic minimum.

A nominal quadrature input to the logic element 106 dictates a nominal 50% duty cycle at the output of the logic element 106. Using a quadrature input as an example, when there is a phase difference between the signals on connections 102 and 104 other than 90 degrees, the output of the logic element 106 will not be at 50% duty cycle. In this example, when there is a difference between the output, $V_{AVG}$, of the logic element 106 on connection 134 and the output, $V_{OUT}$, of the voltage divider 140 on connection 142, then the difference is detected by the comparator 112. The comparator 112 then attempts to eliminate the difference between the level of the signals on connections 134 and 142 by generating a feedback signal, $V_{CTRL}$, to alter the delay applied to the input signal on connection 102 by the variable delay element 110 so that the signal on connections 102 and 104 are nominally separated by 90 degrees, i.e., they have a quadrature relationship.

As stated above, the resistances 136 and 138 can be selected so that the phase difference between the signals on connections 102 and 104 can have a predetermined value ranging from 0 to 180 degrees.

Figure 2:
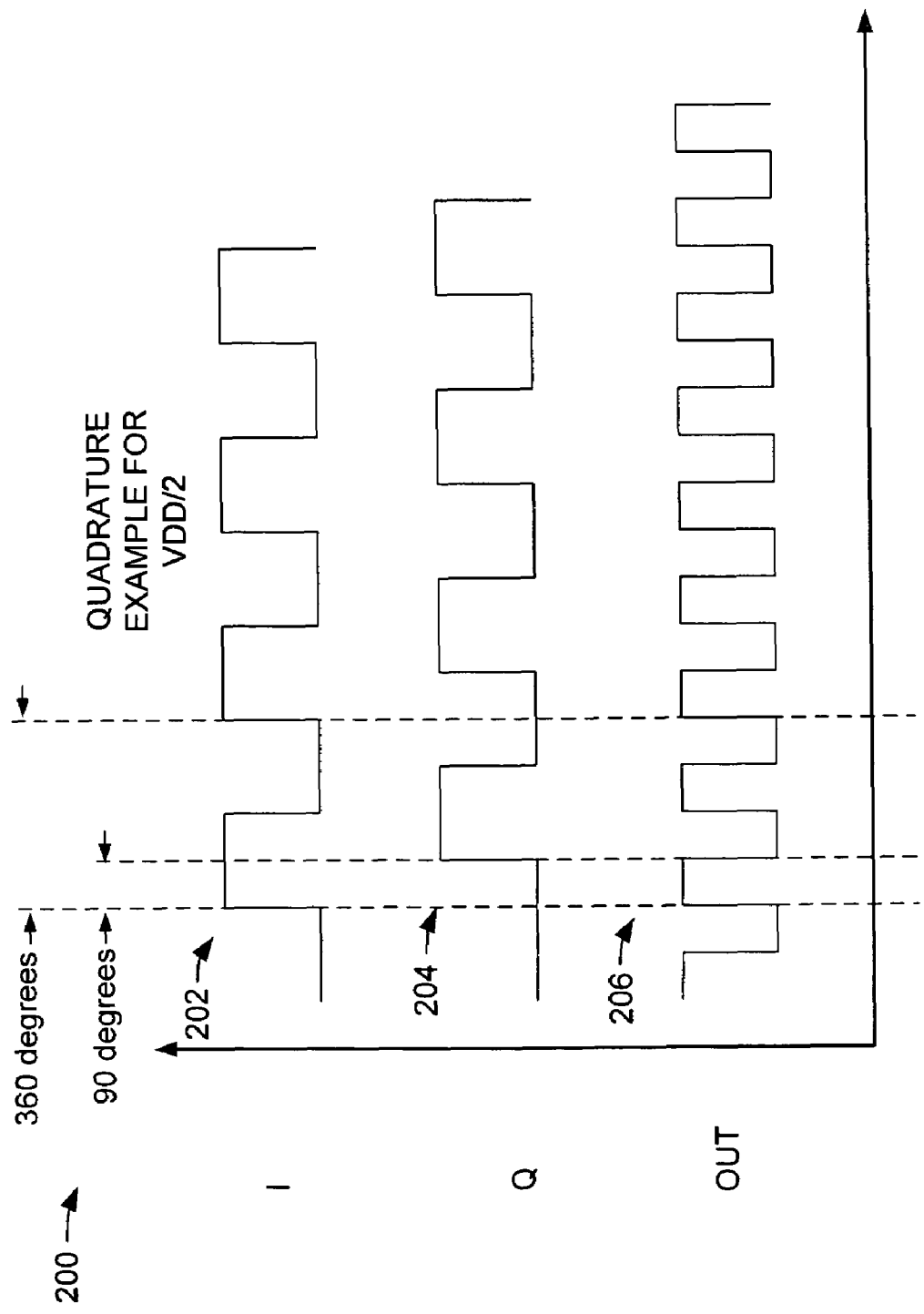
FIG. 2 is a timing diagram illustrating the operation of an embodiment of the precision phase generator of FIG. 1.

FIG. 2 is a timing diagram 200 illustrating the operation of an embodiment of the phase generator 100 of FIG. 1. The timing diagram illustrates an embodiment of the phase generator 100 that produces in-phase (I) and quadrature-phase (Q) signals. However, as stated above, other phase relationships are possible. The in-phase (I) component of the signal is illustrated using trace 202 and represents the input signal on connection 102 (FIG. 1). The quadrature-phase signal is illustrated using trace 204 and represents the signal on connection 104 (FIG. 1). In the example shown in FIG. 2, the difference between the in-phase signal 202 and the quadrature-phase signal 204 is nominally 90 degrees. When there is a nominal 90 degree phase offset between the in-phase and quadrature-phase signals, the output of the logic element 106 (FIG. 1) is a 50% duty cycle signal and is illustrated using trace 206.

The output of the logic element 106 illustrated using the trace 206 is a signal having a frequency that is double the frequency of the input signal on connection 102 (trace 202). In this manner, the phase generator 100 (FIG. 1) operates as a frequency doubler. The feedback loop formed by the comparator 112, the voltage divider 140 and the control signal, $V_{CTRL}$ diminishes the cycle to cycle variation when doubling the frequency of the input signal 202. The accuracy of the quadrature signals provided on connections 102 and 104 (FIG. 1) minimizes any distortion of the duty cycle of the signal at the output of the logic element 106 (trace 206).

If the logic element 106 is implemented as an AND gate, the output of the AND gate will not result in doubling of the clock frequency and will have a 25% duty cycle when the input relative to the delay is quadrature. This means that the reference signal on connection 142 should be adjusted to equal ¼ $V_{DD}$ to achieve a phase difference between the in-phase signal 202 and the quadrature-phase signal 204 of 90 degrees if an AND gate is implemented as the logic element 106 (FIG. 1). This can be advantageous, especially if phases other than 90 degrees are being generated because the pulse width output of an XOR gate may become too narrow when the frequency is high and if the output is not a 50% duty cycle.

Figure 3:
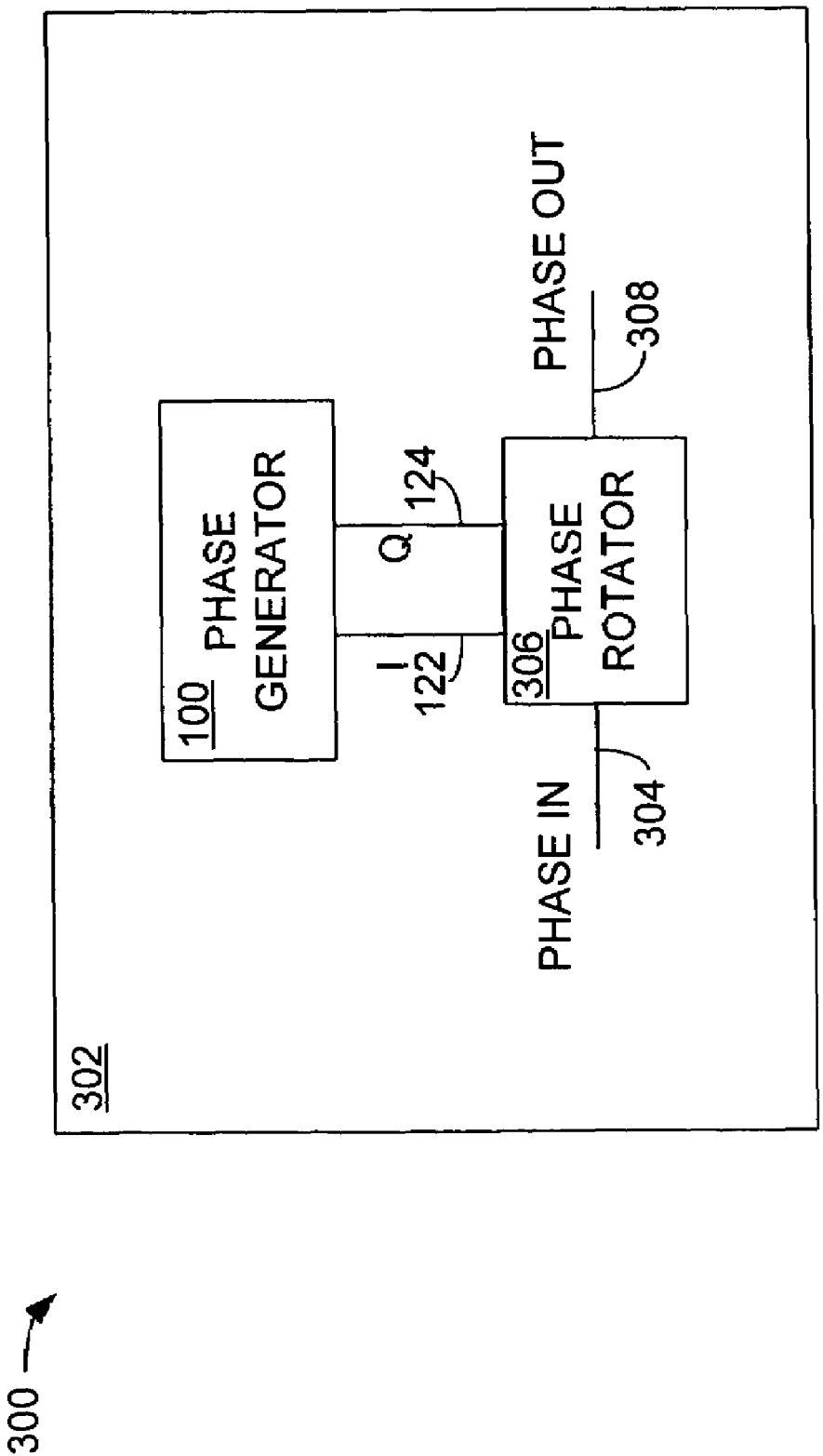
FIG. 3 is a block diagram illustrating an embodiment of the phase generator implemented in a portion of an integrated circuit.

FIG. 3 is a block diagram illustrating an embodiment of the phase generator 100 implemented in a portion of an integrated circuit. The circuit portion 302 can be, for example, a circuit that includes a phase rotator. A phase rotator is a circuit element that can be used to alter the phase of a signal. The circuit portion 302 comprises a phase rotator 306 and a phase generator 100. The phase generator 100 supplies offset phase signals on connections 122 and 124. In this example, an in-phase (I) signal is supplied on connection 122 and a quadrature-phase (Q) signal is supplied on connection 124.

An input signal to the phase rotator 306 is provided on connection 304. The phase rotator 306 alters the phase of the signal on connection 304 in a manner related to the phase of the signals on connections 122 and 124. The output of the phase rotator 306 on connection 308 is the phase-rotated signal and in this embodiment is a signal that is rotated in phase by 90 degrees. A phase rotator can rotate an input clock signal by 0-360 degrees provided that the signals I, Q, IB, QB, where IB and QB are the compliments of I and Q respectively, are provided. A phase rotator operates by interpolating a phase that lies between two phases. Having I, Q, IB, QB effectively provides 360 degrees of freedom. Phase rotators are devices that are meant to be adjusted until the desired output phase is achieved. A phase rotator can also provide a frequency offset if the rotation is continuous.

Figure 4:
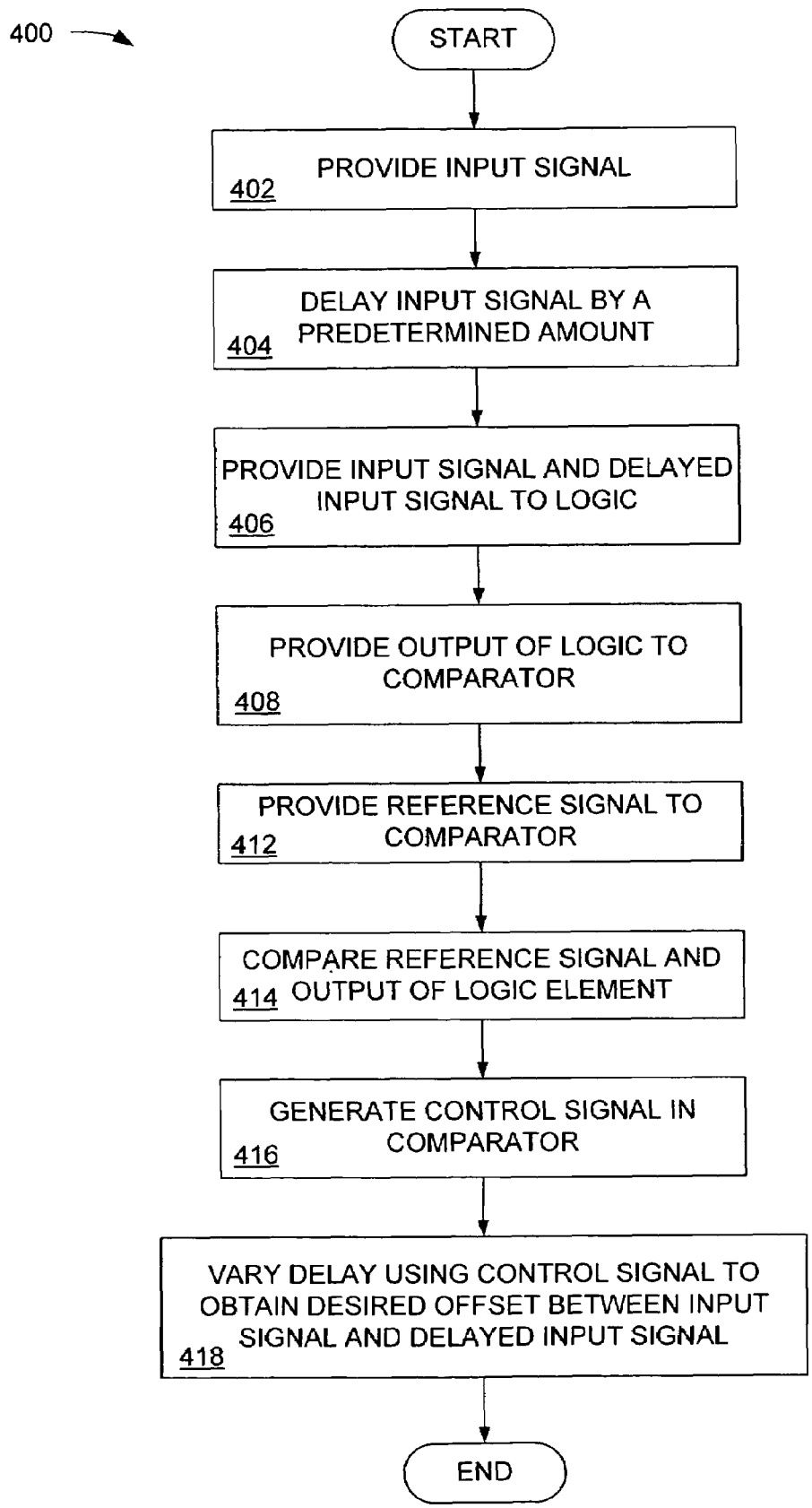
FIG. 4 is a flowchart showing the operation of an embodiment of the precision phase generator of FIG. 1.

FIG. 4 is a flowchart showing the operation of an embodiment of the phase generator 100 of FIG. 1. In block 402, an input signal is provided to the phase generator 100. In block 404, the variable delay element 110 delays the input signal by a predetermined amount and generates a delayed version of the input signal. In an embodiment, the difference between the input signal and the delayed version of the input signal is a nominal 90 degrees, thus making the signals quadrature.

In block 406 the input signal and the delayed version of the input signal are provided to a logic element. In an embodiment, the logic element is an exclusive OR (XOR) gate. However, other logic elements that can determine a phase difference between two signals can be used. In block 408, the output of the logic element is provided to a comparator. In block 412, a reference signal is provided to the comparator. In an embodiment, the reference signal is generated by a voltage divider. In the quadrature example, the voltage divider divides an input voltage signal by a factor of two. In block 414, the comparator compares the reference signal and the output of the logic element. In block 416, the comparator generates a control signal. In block 418, the control signal is applied to the variable delay element and is used to obtain the desired predetermined delay between the input signal and the delayed version of the input signal.

This disclosure describes the invention in detail using illustrative embodiments. However, it is to be understood that the phase generator defined by the appended claims is not limited to the precise embodiments described.

What is claimed is:

1. A phase generator, comprising:
    a delay element configured to receive an input signal and configured to delay the input signal by a predetermined amount to develop a delayed version of the input signal;
    a logic element configured to receive the input signal and the delayed version of the input signal, the logic element configured to produce a signal dependent on a phase difference between the input signal and the delayed version of the input signal;
    a circuit configured to generate an analog reference signal independent of an output of the logic element and having a fixed amplitude;
    an analog amplitude comparator configured to receive the output of the logic element and the analog reference signal, the analog amplitude comparator configured to generate a control signal that is dependent on the amplitude difference between the output of the logic element and the analog reference signal, where the control signal is applied to the delay element to determine the delay applied to the input signal; and
    a frequency detector configured to affect the control signal in response to the delay between the input signal and the delayed version of the input signal.

2. The phase generator of claim 1, wherein the analog reference signal determines the predetermined delay applied to the input signal.

3. The phase generator of claim 1, wherein the frequency detector is configured to reset the delay element when the delay between the input signal and the delayed version of the input signal reaches 180 degrees.

4. The phase generator of claim 1, wherein the output of the logic element is a signal having a duty cycle that corresponds to a difference in phase between the input signal and the delayed version of the input signal.

5. The phase generator of claim 2, wherein the logic element is an exclusive OR logic gate.

6. The phase generator of claim 2, wherein the circuit configured to generate an analog reference signal further comprises a voltage divider.

7. The phase generator of claim 6, wherein the voltage divider further comprises at least two resistances, the value of the resistances determining a level of the reference signal.

8. A method for generating multiple phases of an input signal, the method comprising:
    providing an input signal having at a first phase;
    delaying the input signal by a predetermined amount to develop a delayed version of the input signal;
    providing the input signal and the delayed version of the input signal to a logic element, the logic element developing a signal that is dependent on a phase difference between the input signal and the delayed version of the input signal;
    generating an analog reference signal independent of an output of the logic element and having a fixed amplitude;
    comparing an amplitude of the output of the logic element and an amplitude of the analog reference signal;
    generating a control signal that is dependent on the amplitude difference between the output of the logic element and the analog reference signal;
    applying the control signal to determine the delay applied to the input signal; and
    affecting the control signal in response to the delay between the input signal and the delayed version of the input signal.

9. The method of claim 8, wherein the analog reference signal determines the predetermined delay applied to the input signal.

10. The method of claim 8, wherein affecting the control signal resets the delayed version of the input signal when the delay between the input signal and the delayed version of the input signal reaches 180 degrees.

11. The method of claim 8, wherein the output of the logic element is a signal having a duty cycle that corresponds to a difference in phase between the input signal and the delayed version of the input signal.

12. The method of claim 8, further comprising implementing the logic element as an exclusive OR logic gate.

13. The method of claim 9, further comprising implementing the circuit configured to generate a reference signal as a voltage divider.

14. A circuit for generating multiple phase signals, comprising:
    a variable delay element configured to receive an input signal and configured to delay the input signal by a predetermined amount to develop at least one delayed version of the input signal;
    a logic element configured to receive the input signal and the at least one delayed version of the input signal, the logic element configured to produce a signal dependent on a phase difference between the input signal and the at least one delayed version of the input signal;
    a voltage divider configured to generate an analog reference signal independent of an output of the logic element and having a fixed amplitude;

an analog amplitude comparator configured to receive the output of the logic element and the analog reference signal, the analog amplitude comparator configured to generate a control signal that is dependent on the amplitude difference between the output of the logic element and the analog reference signal, where the control signal is applied to the variable delay element to determine the delay applied to the input signal; and a frequency detector configured to affect the control signal in response to the delay between the input signal and the delayed version of the input signal.

15. The circuit of claim 14, wherein the analog reference signal determines the predetermined delay applied to the input signal.

16. The circuit of claim 14, wherein the frequency detector is configured to reset the variable delay element when the delay between the input signal and the delayed version of the input signal reaches 180 degrees.

17. The circuit of claim 14, wherein the output of the logic element is a signal having a duty cycle that corresponds to a difference in phase between the input signal and the at least one delayed version of the input signal.

18. The circuit of claim 14, wherein the logic element is an exclusive OR logic gate.

19. The circuit of claim 14, wherein the voltage divider further comprises at least two resistances, the value of the resistances determining a level of the analog reference signal.

20. The circuit of claim 14, wherein the output of the logic element is a signal having a frequency that is twice a frequency of the input signal and the at least one delayed version of the input signal.

* * * * *